US008902643B2

(12) United States Patent
Berger et al.

(10) Patent No.: US 8,902,643 B2
(45) Date of Patent: Dec. 2, 2014

(54) APPARATUS, SYSTEM, AND METHOD FOR WRITING MULTIPLE MAGNETIC RANDOM ACCESS MEMORY CELLS WITH A SINGLE FIELD LINE

(71) Applicant: Crocus Technology, Inc., Santa Clara, CA (US)

(72) Inventors: Neal Berger, Cupertino, CA (US); Jean-Pierre Nozieres, Le Sappey en Chartreuse (FR); Virgile Javerliac, Grenoble (FR)

(73) Assignee: Crocus Technology Inc., Santa Clara, CA (US)

( * ) Notice: Subject to any disclaimer, the term of this patent is extended or adjusted under 35 U.S.C. 154(b) by 238 days.

(21) Appl. No.: 13/648,221

(22) Filed: Oct. 9, 2012

(65) Prior Publication Data

US 2013/0094283 A1    Apr. 18, 2013

Related U.S. Application Data

(60) Provisional application No. 61/545,469, filed on Oct. 10, 2011.

(51) Int. Cl.
*G11C 11/00* (2006.01)
*G11C 8/08* (2006.01)
*G11C 11/16* (2006.01)

(52) U.S. Cl.
CPC .............. *G11C 11/1675* (2013.01); *G11C 8/08* (2013.01)
USPC ............................ 365/158; 365/171; 365/173

(58) Field of Classification Search
USPC .......................................... 365/158, 171, 173
See application file for complete search history.

(56) References Cited

U.S. PATENT DOCUMENTS

| 7,502,249 B1 * | 3/2009 | Ding ............................. 365/158 |
| 7,532,505 B1 * | 5/2009 | Ding ............................. 365/158 |
| 7,924,274 B2 * | 4/2011 | Guttag .......................... 345/204 |
| 2001/0038548 A1 | 11/2001 | Perner et al. |
| 2006/0215444 A1 | 9/2006 | Perner et al. |
| 2007/0140033 A1 | 6/2007 | Yang et al. |
| 2008/0084724 A1 | 4/2008 | Nozieres et al. |
| 2009/0213643 A1 | 8/2009 | Angerbauer et al. |
| 2010/0110744 A1 | 5/2010 | El Baraji et al. |
| 2011/0110158 A1 | 5/2011 | Schuette |

OTHER PUBLICATIONS

International Search Report and Written Opinion issued to international patent application No. PCT/US12/59370, Dec. 10, 2012, 10 pgs.

* cited by examiner

*Primary Examiner* — Son Dinh
(74) *Attorney, Agent, or Firm* — Cooley LLP

(57) ABSTRACT

A memory device includes a plurality of magnetic random access memory (MRAM) cells, a field line, and a field line controller configured to generate a write sequence that traverses the field line. The write sequence is for writing a multi-bit word to the plurality of MRAM cells. The multi-bit word includes a first subset of bits having a first polarity and a second subset of bits having a second polarity. The write sequence writes concurrently to at least a subset of the plurality of MRAM cells corresponding to the first subset of bits having the first polarity, then subsequently writes concurrently to a remaining subset of the plurality of MRAM cells corresponding to the second subset of bits having the second polarity.

20 Claims, 5 Drawing Sheets

US 8,902,643 B2

APPARATUS, SYSTEM, AND METHOD FOR WRITING MULTIPLE MAGNETIC RANDOM ACCESS MEMORY CELLS WITH A SINGLE FIELD LINE

CROSS-REFERENCE TO RELATED APPLICATION

The present application claims the benefit of U.S. Provisional Application No. 61/545,469, filed on Oct. 10, 2011, the disclosure of which is incorporated herein by reference in its entirety.

FIELD OF THE INVENTION

The invention relates generally to a memory array field line structure and, more particularly, to an apparatus, system, and method for writing multiple magnetic random access memory cells with a single field line.

BACKGROUND

MRAM devices have become the subject of increasing interest, in view of the discovery of magnetic tunnel junctions having a strong magnetoresistance at ambient temperatures. MRAM devices offer a number of benefits, such as faster speed of writing and reading, non-volatility, and insensitivity to ionizing radiations. Consequently, MRAM devices are increasingly replacing memory devices that are based on a charge state of a capacitor, such as dynamic random access memory devices and flash memory devices.

It is against this background that a need arose to develop the apparatus, system, and method described herein.

SUMMARY OF THE INVENTION

One aspect of the invention relates to a memory device. In one embodiment, the memory device includes a plurality of magnetic random access memory (MRAM) cells, a field line, and a field line controller configured to generate a write sequence that traverses the field line. The write sequence is for writing a multi-bit word to the plurality of MRAM cells. The multi-bit word includes a first subset of bits having a first polarity and a second subset of bits having a second polarity. The write sequence writes concurrently to at least a subset of the plurality of MRAM cells corresponding to the first subset of bits having the first polarity, then subsequently writes concurrently to a remaining subset of the plurality of MRAM cells corresponding to the second subset of bits having the second polarity.

In another embodiment, the memory device includes an array of magnetic random access memory (MRAM) cells including a plurality of rows and a plurality of columns, a plurality of field lines, and a field line controller configured to generate a plurality of write signals. Each of the plurality of write signals traverses a corresponding one of the plurality of field lines. In a initial write cycle, each of the plurality of write signals writes concurrently to a corresponding one of the plurality of rows of MRAM cells such that each of at least a first subset of the plurality of columns of MRAM cells is configured to a first state. In a subsequent write cycle, each of the plurality of write signals writes concurrently to the corresponding one of the plurality of rows of MRAM cells such that each of a second subset of the plurality of columns of MRAM cells is configured to an updated state, while each of the first subset of the plurality of columns of MRAM cells remains configured to the first state.

In another embodiment, the memory device includes a plurality of magnetic random access memory (MRAM) cells, a field line, a field line controller configured to generate a write sequence on the field line, a plurality of bit lines, and a bit line controller. The write sequence writes at least a subset of the plurality of MRAM cells to a first value during a first write cycle, and writes a remaining subset of the plurality of MRAM cells to a second value during a second write cycle. The bit line controller is configured to generate a first heating signal that traverses each of at least a subset of the plurality of bit lines electrically connected to corresponding ones of the at least a subset of the plurality of MRAM cells. The first heating signal heats each of the at least a subset of the plurality of MRAM cells for a heating time period during a first write cycle. The bit line controller is configured to generate a second heating signal that traverses each of a remaining subset of the plurality of bit lines electrically connected to corresponding ones of the remaining subset of the plurality of MRAM cells. The second heating signal pre-heats each of the remaining subset of the plurality of MRAM cells for a pre-heating time period during the first write cycle, and heats the each of the remaining subset of the plurality of MRAM cells for a heating time period during the second write cycle that is shorter than the heating time period during the first write cycle, so that a duration of the second write cycle is shorter than a duration of the first write cycle.

DETAILED DESCRIPTION

Definitions

The following definitions apply to some of the aspects described with respect to some embodiments of the invention. These definitions may likewise be expanded upon herein.

As used herein, the singular terms "a," "an," and "the" include plural referents unless the context clearly dictates otherwise. Thus, for example, reference to an object can include multiple objects unless the context clearly dictates otherwise.

As used herein, the term "set" refers to a collection of one or more objects. Thus, for example, a set of objects can include a single object or multiple objects. Objects of a set also can be referred to as members of the set. Objects of a set can be the same or different. In some instances, objects of a set can share one or more common characteristics.

As used herein, the terms "substantially" and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical manufacturing tolerances or variability of the embodiments described herein.

As used herein, the term "adjacent" refers to being near or adjoining. Adjacent objects can be spaced apart from one another or can be in actual or direct contact with one another. In some instances, adjacent objects can be formed integrally with one another.

As used herein, the terms "connect," "connected," and "connection" refer to an operational coupling or linking. Connected objects can be directly coupled to one another or can be indirectly coupled to one another, such as via another set of objects.

As used herein, the term "main group element" refers to a chemical element in any of Group IA (or Group 1), Group IIA (or Group 2), Group IIIA (or Group 13), Group IVA (or Group 14), Group VA (or Group 15), Group VIA (or Group 16), Group VIIA (or Group 17), and Group VIIIA (or Group 18). A main group element is also sometimes referred to as a s-block element or a p-block element.

As used herein, the term "transition metal" refers to a chemical element in any of Group IVB (or Group 4), Group VB (or Group 5), Group VIB (or Group 6), Group VIIB (or Group 7), Group VIIIB (or Groups 8, 9, and 10), Group IB (or Group 11), and Group IIB (or Group 12). A transition metal is also sometimes referred to as a d-block element.

As used herein, the term "rare earth element" refers to any of Sc, Y, La, Ce, Pr, Nd, Pm, Sm, Eu, Gd, Tb, Dy, Ho, Er, Tm, Yb, and Lu.

Detailed Description of Embodiments of the Invention

Figure 1:
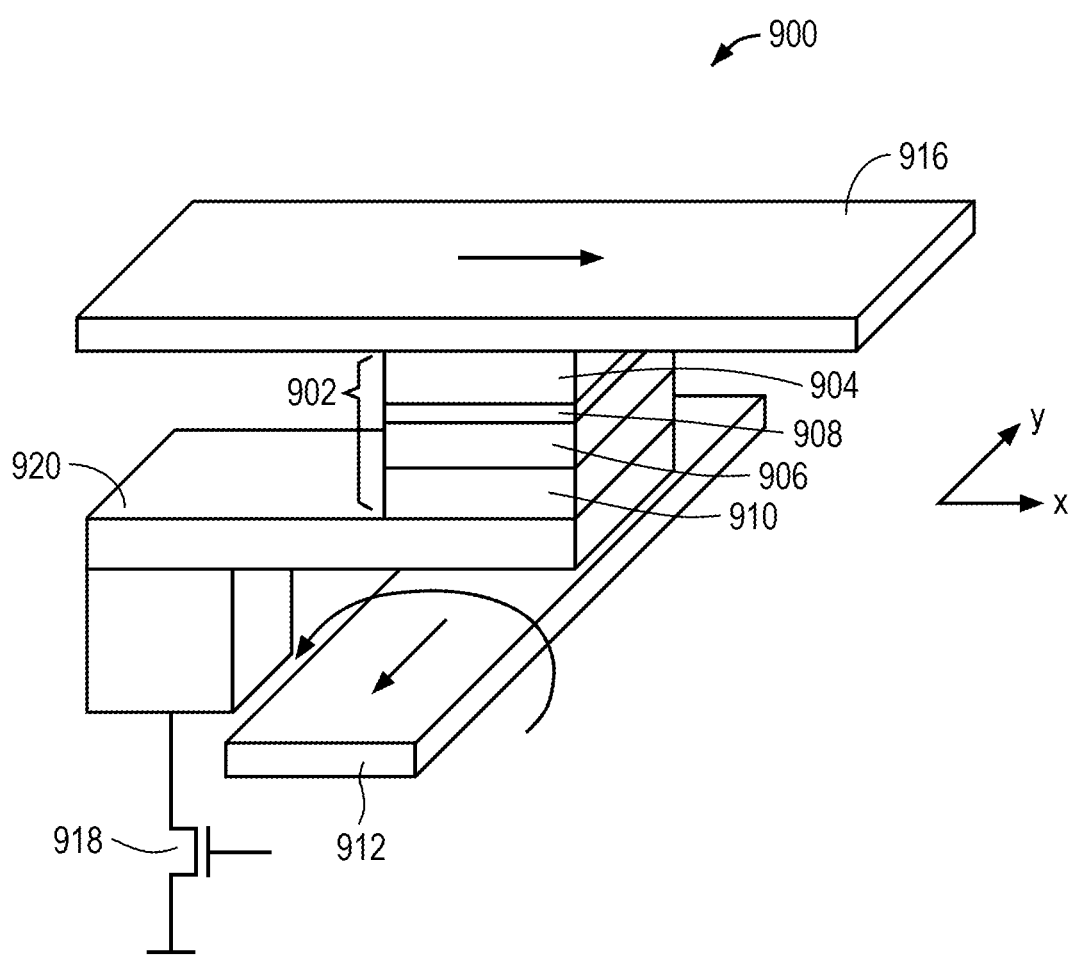
FIG. 1 illustrates a perspective view of a magnetic cell included in a memory device, according to an embodiment of the invention.

FIG. 1 illustrates a perspective view of a magnetic cell 902 included in a memory device 900, according to an embodiment of the invention. For ease of presentation and to motivate certain advantages and functions of the memory device 900, the single magnetic cell 902 is illustrated in FIG. 1, although it is contemplated that multiple magnetic cells 902 can be included in the memory device 900. The magnetic cell 902 may be a magnetic random access memory (MRAM) cell.

The magnetic cell 902 can be implemented with one magnetization, namely a storage magnetization, that is aligned to represent the stored data value, and another magnetization, namely a sense magnetization, that is aligned to represent the target data value. Alternatively, the magnetic cell 902 can be implemented with the storage magnetization and a reference magnetization, which is typically a magnetization with a fixed direction. Conventional memories can be susceptible to unauthorized data access by using techniques to derive a charge state of a capacitor. In contrast, the use of magnetization directions renders the memory device 900 less susceptible to such unauthorized data access, thereby further enhancing the level of security.

Thermally assisted switching (TAS) technology, as applied to MRAM's, provides one way of implementing the memory device 900 explained herein. In one embodiment, during a programming cycle, a relatively small current is applied through the magnetic cell 902 to heat a pinning layer 910 by Ohmic effect. When a temperature of the pinning layer 910 is above a threshold temperature, the storage magnetization direction is unpinned, thereby allowing a single bit to be programmed by applying a current through a field line 912 that is magnetically connected to the cell. A "0" can be stored by applying the current in one particular direction, and a "1" can be stored by applying the current in an opposite direction. After programming, the magnetic cell 902 is cooled below the threshold temperature, thereby pinning the storage magnetization in a programmed direction.

In one embodiment, the memory device 900 may be configured to support pattern checking. In a pattern checking cycle, a "0" or a "1" is presented to the magnetic cell 902 by activating the field line 912 to switch the sense magnetization direction, in a manner consistent with directions used for the programming cycle. The cell has a typical resistance value of about 1 KΩ when the two magnetization directions are substantially parallel, and about 2 KΩ when the two magnetization directions are substantially antiparallel.

In another embodiment, the memory device 900 may program the storage magnetization relative to a reference magnetization, which typically has a fixed direction. When the respective magnetizations of the reference layer and the storage layer are antiparallel, a resistance of the magnetic tunnel junction is high, namely having a resistance value of typically about 2 KΩ corresponding to a high logic state "1". On the other hand, when the respective magnetizations are parallel, the resistance of the magnetic tunnel junction is low, namely having a resistance value of typically about 1 KΩ corresponding to a low logic state "0". A logic state of the magnetic cell 902 is read by comparing its resistance value to a reference resistance value, which is derived from a reference cell or a group of reference cells and represents an in-between resistance value between that of the high logic state "1" and the low logic state "0".

Referring to FIG. 1, the magnetic cell 902 is implemented as a magnetic tunnel junction, and includes a sense layer 904, a storage layer 906, and a layer 908 that is disposed between the sense layer 904 and the storage layer 906. Other implementations of the magnetic cell 902 are contemplated. For example, the relative positioning of the sense layer 904 and the storage layer 906 can be reversed, with the storage layer 906 disposed above the sense layer 904.

Referring to FIG. 1, each of the sense layer 904 and the storage layer 906 includes, or is formed of, a magnetic material and, in particular, a magnetic material of the ferromagnetic type. A ferromagnetic material can be characterized by a substantially planar magnetization with a particular coercivity, which is indicative of a magnitude of a magnetic field to reverse the magnetization after it is driven to saturation in one direction. In general, the sense layer 904 and the storage layer 906 can include the same ferromagnetic material or different ferromagnetic materials. As illustrated in FIG. 1, the sense layer 904 can include a soft ferromagnetic material, namely one having a relatively low coercivity, while the storage layer 906 can include a hard ferromagnetic material, namely one having a relatively high coercivity. In such manner, a magnetization of the sense layer 904 can be readily varied under low-intensity magnetic fields during pattern checking cycles, while a magnetization of the storage layer 906 remains stable. Suitable ferromagnetic materials include transition metals, rare earth elements, and their alloys, either with or without main group elements. For example, suitable ferromagnetic materials include iron ("Fe"), cobalt ("Co"), nickel ("Ni"), and their alloys, such as permalloy (or $Ni_{80}Fe_{20}$); alloys based on Ni, Fe, and boron ("B"); $Co_{90}Fe_{10}$;

and alloys based on Co, Fe, and B. In some instances, alloys based on Ni and Fe (and optionally B) can have a smaller coercivity than alloys based on Co and Fe (and optionally B). A thickness of each of the sense layer 904 and the storage layer 906 can be in the nm range, such as from about 1 nm to about 20 nm or from about 1 nm to about 10 nm. Other implementations of the sense layer 904 and the storage layer 906 are contemplated. For example, either, or both, of the sense layer 904 and the storage layer 906 can include multiple sub-layers in a fashion similar to that of the so-called synthetic antiferromagnetic layer.

In another embodiment, the magnetic cell 902 may include the storage layer 906 and a reference layer instead of the sense layer 904, with the layer 908 disposed between the storage layer 906 and the reference layer. Each of the reference layer and the storage layer 906 includes, or is formed of, a magnetic material and, in particular, a magnetic material of the ferromagnetic type, the characteristics of which are described previously with reference to FIG. 1. In general, the reference layer and the storage layer 906 can include the same ferromagnetic material or different ferromagnetic materials. The reference layer is different from the sense layer 904 in that the reference layer typically has a high coercivity, such as a coercivity higher than the storage layer 906.

The layer 908 functions as a tunnel barrier, and includes, or is formed of, an insulating material. Suitable insulating materials include oxides, such as aluminum oxide (e.g., $Al_2O_3$) and magnesium oxide (e.g., MgO). A thickness of the layer 908 can be in the nm range, such as from about 1 nm to about 10 nm.

Referring to FIG. 1, the magnetic cell 902 is implemented to store data corresponding to one of a pair of logic states. In other words, the magnetic cell 902 is a single-bit cell that stores a single-bit data value, although multi-bit implementations for storing multi-bit data values are also contemplated. In accordance with the single-bit implementation of the magnetic cell 902, the storage layer 906 has a storage magnetization that is switchable between a pair of directions corresponding to the pair of logic states. Referring to FIG. 1, the magnetic cell 902 also includes the pinning layer 910, which is disposed adjacent to the storage layer 906 and, through exchange bias, stabilizes the storage magnetization along a particular one of the pair of directions when a temperature within, or in the vicinity of, the pinning layer 910 is lower than a temperature $T_{BS}$. The temperature $T_{BS}$ can correspond to a blocking temperature, a Neel temperature, or another threshold temperature. The pinning layer 910 unpins, or decouples, the storage magnetization direction when the temperature is at, or above, the blocking temperature $T_{BS}$, thereby allowing the storage magnetization direction to be switched to another one of the pair of directions.

In one embodiment, such a pinning layer is omitted adjacent to the sense layer 904, and, as a result, the sense layer 904 has a sense magnetization direction that is unpinned and is readily varied, with the substantial absence of exchange bias.

In another embodiment, as previously described, the magnetic cell 902 includes a reference layer instead of the sense layer 904. In this embodiment, an additional pinning layer may be disposed adjacent to the reference layer. This additional pinning layer may be characterized by a threshold temperature $T_{BR}$, with $T_{BR} > T_{BS}$. The temperature $T_{BR}$ can correspond to a blocking temperature, a Neel temperature, or another threshold temperature. Through exchange bias, this additional pinning layer stabilizes the reference magnetization along a substantially fixed direction at temperatures lower than the threshold temperature $T_{BR}$.

The pinning layer 910 (and the additional pinning layer disposed adjacent to the reference layer in the alternative embodiment) includes, or is formed of, a magnetic material and, in particular, a magnetic material of the antiferromagnetic type. Suitable antiferromagnetic materials include transition metals and their alloys. For example, suitable antiferromagnetic materials include alloys based on manganese ("Mn"), such as alloys based on iridium ("Ir") and Mn (e.g., IrMn); alloys based on Fe and Mn (e.g., FeMn); alloys based on platinum ("Pt") and Mn (e.g., PtMn); and alloys based on Ni and Mn (e.g., NiMn). In some instances, the blocking temperature $T_{BS}$ of alloys based on Ir and Mn (or based on Fe and Mn) can be in the range of about 120° C. to about 220° C. or about 150° C. to about 200° C., and can be smaller than the blocking temperature $T_{BS}$ of alloys based on Pt and Mn (or based on Ni and Mn), which can be in the range of about 300° C. to about 350° C.

Still referring to FIG. 1, the memory device 900 also includes a set of traces (or strip conductors) to provide programming and pattern checking functions. Specifically, a bit line 916 is electrically connected to the magnetic cell 902 on the side of the sense layer 904 (or, in an alternative embodiment, the reference layer) and is substantially orthogonal to the field line 912, which is disposed below and magnetically connected to the magnetic cell 902 on the side of the storage layer 906. The memory device 900 further includes a transistor 918, which is electrically connected, through a strap 920, to the magnetic cell 902 on the side of the storage layer 906. The transistor 918 is switchable between a blocked mode (OFF) and a conducting mode (ON), thereby allowing the flow of a current through the magnetic cell 902. Other implementations of the memory device 900 are contemplated. For example, the relative orientation of the bit line 916 and the field line 912 can be varied from that illustrated in FIG. 1. As another example, the relative positioning of the bit line 916 and the field line 912 can be reversed, with the field line 912 disposed above the bit line 916.

During a TAS-type programming cycle, the magnetic cell 902 is heated by applying a heating current through the magnetic cell 902 via the bit line 916, with the transistor 918 in a conducting mode. The magnetic cell 902 is heated to a temperature above the blocking or threshold temperature $T_{BS}$ of the pinning layer 910, such that a magnetization of the storage layer 906 is unpinned. (In the alternative embodiment, the magnetic cell 902 is heated to a temperature above the blocking or threshold temperature $T_{BS}$ of the pinning layer 910 but below the blocking or threshold temperature $T_{BR}$ of the additional pinning layer, such that a magnetization of the storage layer 906 is unpinned but the magnetization of the reference layer remains fixed.) Simultaneously or after a short time delay, the field line 912 is activated to induce a write magnetic field to switch the storage magnetization from an initial direction to another direction. Specifically, a write current is applied through the field line 912 to induce the write magnetic field to switch the storage magnetization direction, according to a reference bit to be stored. Because the storage magnetization direction can be aligned according to the write magnetic field, the storage magnetization direction can be switched between multiple directions according to a programming encoding scheme. One possible encoding scheme is implemented with a pair of directions that are displaced by about 180°, such that a "0" is assigned to one of the pair of directions, and a "1" is assigned to another one of the pair of directions.

Once the storage magnetization is switched to a programmed direction, the transistor 918 is switched to a blocked mode to inhibit current flow through the magnetic cell 902, thereby cooling the magnetic cell 902. The write magnetic field can be maintained during cooling of the magnetic cell 902, and can be deactivated once the magnetic cell 902 has cooled below the blocking temperature $T_{BS}$ of the pinning layer 910. Because the storage magnetization direction is pinned by the exchange bias of the pinning layer 910, its orientation remains stable so as to retain the stored data.

Other implementations of programming cycles are contemplated. For example, the magnetic cell 902 can be implemented with an anisotropic shape having a relatively high aspect ratio, such as about 1.5 or more. In such an anisotropic-shaped implementation of the magnetic cell 902, the storage magnetization direction can be switched and can remain stable, without requiring the pinning layer 910. As another example, a programming cycle can be carried out by applying a write current through the magnetic cell 902 via the bit line 916, using the so-called spin transfer torque ("STT") effect. In such a STT-type programming cycle, the write current can become spin polarized by passing through a polarizing magnetic layer (not illustrated) or through the sense layer 904, and a magnetization of the storage layer 906 can be switched according to a spin-polarized orientation of the write current. Switching of the storage layer magnetization with the spin-polarized write current also can be combined with a TAS-type programming cycle, such as by heating the magnetic cell 902 above the blocking temperature $T_{BS}$ and then applying the spin-polarized write current through the magnetic cell 902.

In one embodiment, the memory device 900 may be configured to support pattern checking. During a pattern checking cycle, the field line 912 is activated to induce a compare magnetic field to vary a magnetization of the sense layer 904. Specifically, a compare current is applied through the field line 912 to induce the compare magnetic field to vary the sense magnetization direction, according to a target bit to be compared with a reference bit. Because the sense layer 904 is subject to little or no exchange bias, the sense magnetization direction can be readily varied under low-intensity magnetic fields and at a temperature below the blocking temperature $T_{BS}$, while the storage magnetization remains stable in a programmed direction. The field line 912 is activated to induce the compare magnetic field that is consistent with a programming encoding scheme. Because the sense magnetization direction can be aligned according to the compare magnetic field, the sense magnetization direction can be switched to a particular direction assigned to a "0" or a "1", according to the target bit presented for comparison.

As part of the pattern checking cycle, a degree of alignment between the sense magnetization direction and the storage magnetization direction is determined by applying a sense current through the magnetic cell 902 via the bit line 916, with the transistor 918 in a conducting mode. Measuring a resulting voltage across the magnetic cell 902 when the sense current is applied yields a resistance value of the magnetic cell 902 for a particular direction of the sense magnetization corresponding to a particular target bit. Alternatively, a resistance value can be determined by applying a voltage across the magnetic cell 902 and measuring a resulting current. When the respective magnetizations of the sense layer 904 and the storage layer 906 are antiparallel, a resistance value of the magnetic cell 902 typically corresponds to a maximum value, namely $R_{max}$, and, when the respective magnetizations are parallel, a resistance value of the magnetic cell 902 typically corresponds to a minimum value, namely $R_{min}$. A resulting resistance value of the magnetic cell 902 can be compared with a reference resistance value $R_{ref}$, which represents an in-between resistance value between $R_{max}$ and $R_{min}$. A matching response of "yes" or "no" can be determined based on whether the resistance value of the magnetic cell 902 is greater than $R_{ref}$, which indicates an antiparallel alignment between the magnetization directions, or smaller than $R_{ref}$, which indicates a parallel alignment between the magnetization directions.

As previously described, in another embodiment, the memory device 900 may program the storage magnetization relative to a reference magnetization, which typically has a fixed direction. When the respective magnetizations of the reference layer and the storage layer are antiparallel, a resistance of the magnetic tunnel junction is high, namely having a resistance value $R_{max}$ corresponding to a high logic state "1". On the other hand, when the respective magnetizations are parallel, the resistance of the magnetic tunnel junction is low, namely having a resistance value $R_{min}$ corresponding to a low logic state "0". A logic state of a MRAM cell is read by comparing its resistance value to a reference resistance value $R_{ref}$, which represents an in-between resistance value between that of the high logic state "1" and the low logic state "0".

Figure 2:
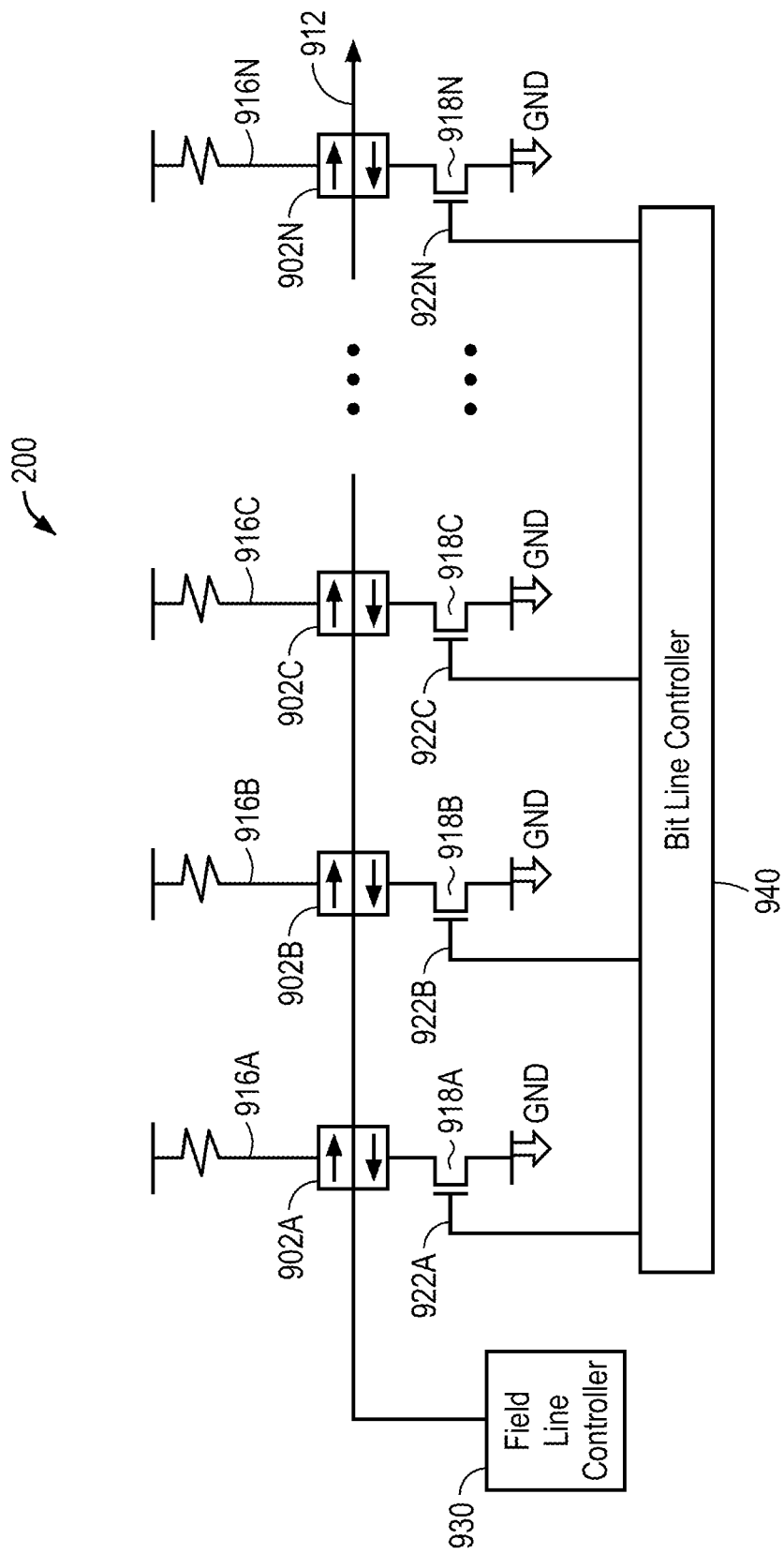
FIG. 2 illustrates a memory device including multiple magnetic cells that are magnetically coupled to a field line, according to an embodiment of the invention.

FIG. 2 illustrates a memory device 200 including multiple magnetic cells 902 that are magnetically coupled to the field line 912, according to an embodiment of the invention. A field line controller 930 may be coupled to the field line 912. As described further with reference to FIGS. 3 and 4, the field line controller 930 may be configured to generate a write signal that traverses the field line 912. The write signal may be a write sequence, such as a sequence of current and/or voltage pulses. The write sequence may be for writing a multi-bit word to the multiple magnetic cells 902. A bit line controller 940 may be coupled to the bit lines 916. In one embodiment, the bit line controller 940 may generate a heating signal that traverses one or more of the bit lines 916. For example, the bit line controller 940 may switch on and off corresponding ones of the transistors 918, thereby turning on and off the flow of a current through corresponding ones of the magnetic cells 902.

For ease of presentation and to motivate certain advantages and functions of the memory device 200, a single row of multiple magnetic cells 902A-902N is illustrated in FIG. 2, and the single row of multiple magnetic cells 902 is magnetically coupled to the single field line 912. It is contemplated that the memory device 200 may include additional rows of multiple magnetic cells 902 (see FIG. 5), where each of the additional rows is magnetically coupled to a corresponding additional field line 912. As previously described, the magnetic cell 902 may be a magnetic random access memory (MRAM) cell.

Figure 3:
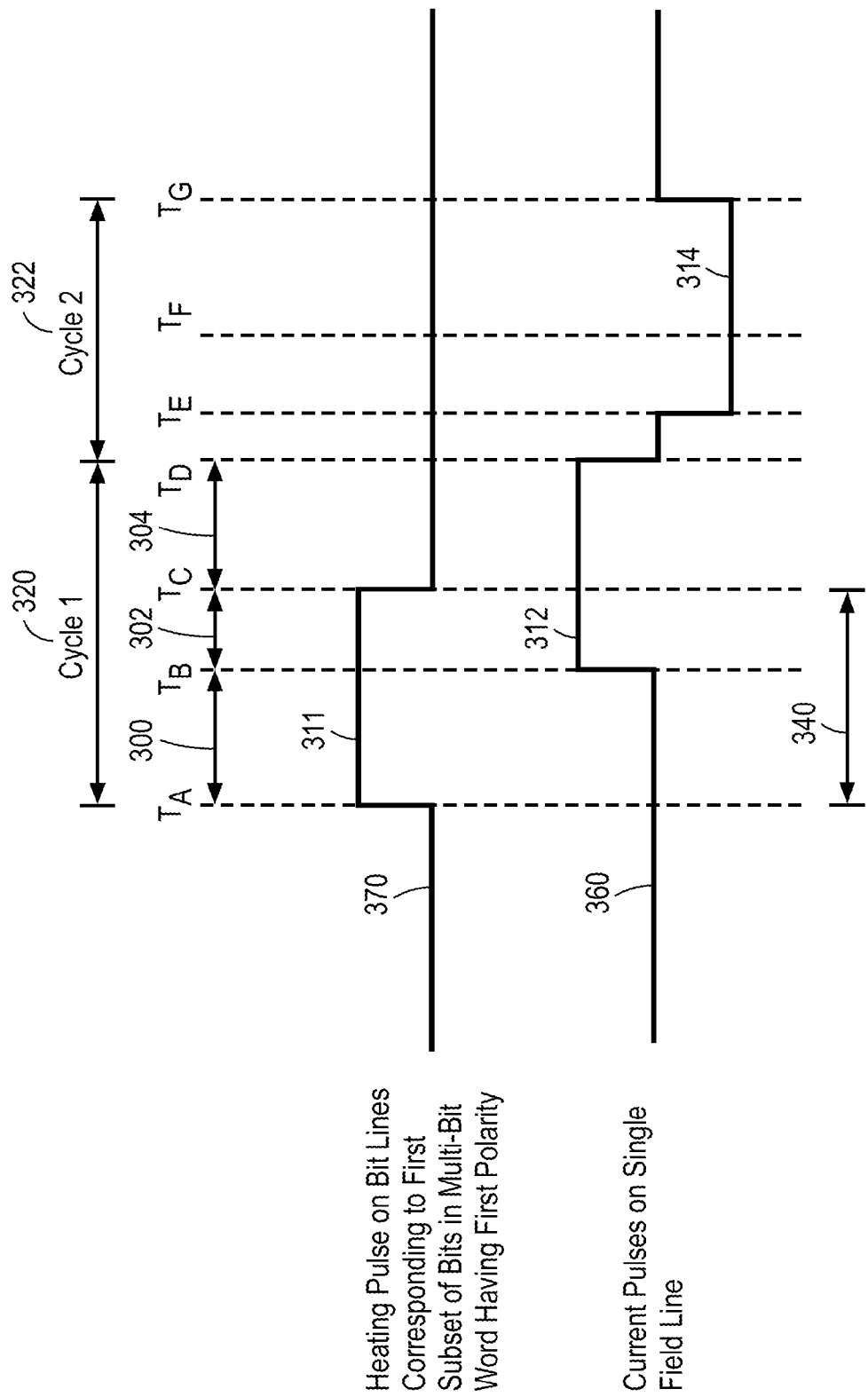
FIG. 3 illustrates timing of a two-cycle write including a heating pulse on one or more bit lines corresponding to a first subset of bits included in a multi-bit word and having a first polarity, and a current pulse on a field line for writing the first subset of bits to a corresponding subset of the magnetic cells, according to an embodiment of the invention.
Figure 4:
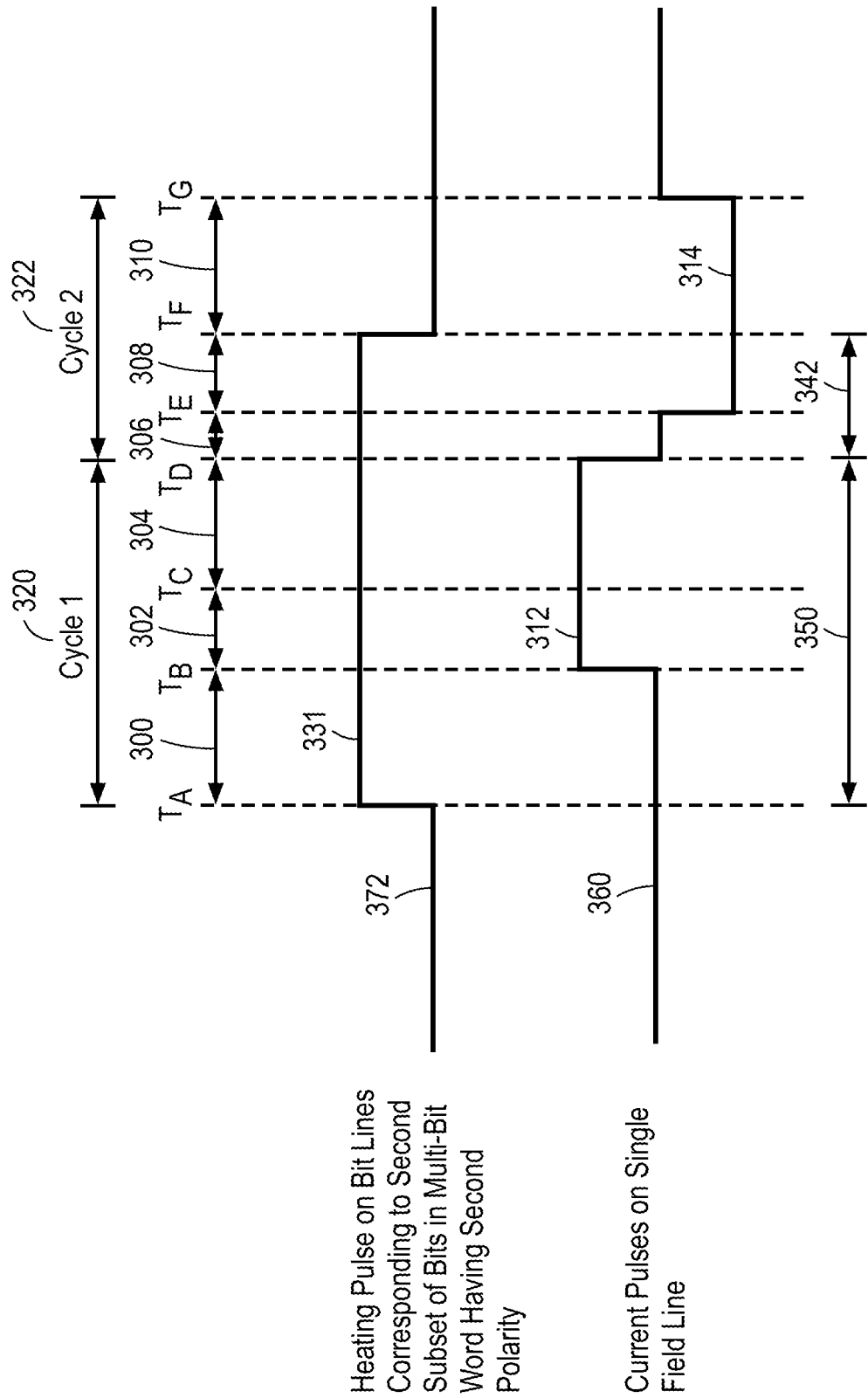
FIG. 4 illustrates timing of a two-cycle write including a heating pulse on one or more bit lines corresponding to a second subset of bits included in the multi-bit word and having a second polarity, and timing of a current pulse on a field line for writing the second subset of bits to a remaining subset of the magnetic cells, according to an embodiment of the invention.

FIG. 3 illustrates timing of a two-cycle write including a heating signal 370 (that may include one or more heating pulses) on one or more bit lines 916 corresponding to a first subset of bits included in a multi-bit word and having a first polarity, and a write sequence 360 (that may include one or more current pulses) on the field line 912 for writing the first subset of bits to a corresponding subset of the magnetic cells 902, according to an embodiment of the invention. FIG. 4 illustrates timing of the two-cycle write including a heating signal 372 (that may include one or more heating pulses) on one or more bit lines 916 corresponding to a second subset of bits included in the multi-bit word and having a second polarity, and timing of the write sequence 360 (that may include one or more current pulses) on the field line 912 for writing the second subset of bits to a remaining subset of the magnetic cells 902, according to an embodiment of the invention. Referring to FIG. 2, the field line controller 930 is configured to generate the write sequence 360 for writing each bit in the multi-bit word to a corresponding one of the magnetic cells 902. In one embodiment, the multi-bit word is written to the magnetic cells 902 in two write cycles, where each write cycle includes heating via bit lines 916 and writing via the field line 912. The heating via the bit lines 916 may be controlled by the bit line controller 940. The writing via the field line 912 may be controlled by the field line controller 930.

Referring to FIGS. 2, 3, and 4, in a first write cycle 320, at least a subset of the magnetic cells 902 corresponding to the first subset of bits in the multi-bit word are written to the first polarity. During the first write cycle 320, the magnetic cells 902 corresponding to the second subset of bits in the multi-bit word may also be written to the first polarity. In a second write cycle 322 subsequent to the first write cycle 320, a remaining subset of the magnetic cells 902 corresponding to the second subset of bits in the multi-bit word are written to the second polarity. During the second write cycle 322, the subset of the magnetic cells 902 corresponding to the first subset of bits in the multi-bit word are not heated by the bit lines 916, and are not written to by the field line 912. The write sequence 360 traversing the single field line 912 can thereby write a multi-bit word to the magnetic cells 902 in two write cycles.

During the first write cycle 320, the heating signal 370 may include a heating pulse 311 that may be applied to a subset of the magnetic cells 902 corresponding to the first subset of bits in the multi-bit word via corresponding bit lines 916. The heating pulse 311 may heat the subset of the magnetic cells for a heating time period 340 during the first write cycle 320. The heating signal 372 may include a heating pulse 331 that may be applied to a remaining subset of the magnetic cells 902 corresponding to the second subset of bits in the multi-bit word via corresponding bit lines 916. The heating pulse 331 may heat the remaining subset of the magnetic cells 902 for a pre-heating time period 350 during the first write cycle 320, and may heat the remaining subset of the magnetic cells 902 for a heating time period 342 during the second write cycle 322. The bit line controller 940 may be configured to switch the transistors 918 between a blocked mode (OFF) and a conducting mode (ON), thereby allowing the flow of the heating pulses 311 and/or 331 through the magnetic cells 902 (via the bit lines 916) in the conducting mode. The heating pulses 311 and 331 heat the pinning layer 910 (see FIG. 1) of the corresponding ones of the magnetic cells 902 to a temperature above the blocking temperature $T_{BS}$ of the pinning layer 910, such that a magnetization of the storage layer 906 (see FIG. 1) of the corresponding ones of the magnetic cells 902 is unpinned.

Each heating pulse 311 may be applied for the time period 340. In one embodiment, the time period 340 may extend from time $T_A$ to time $T_C$. Each heating pulse 331 may be applied for the pre-heating time period 350 and the heating time period 342. In one embodiment, the pre-heating time period 350 may extend from time $T_A$ to time $T_D$, and the heating time period 342 may extend from time $T_D$ to time $T_F$. In this embodiment, a duration of the pre-heating time period 350 is longer than a duration of the time period 340. In this embodiment, the heating time period 342 during the second write cycle 322 is continuous with (overlaps with) the pre-heating time period 350 during the first write cycle 320. In another embodiment, there may be a cooling time period between the pre-heating time period 350 and the heating time period 342, such that the heating time period 342 during the second write cycle 322 is not continuous with (does not overlap with) the pre-heating time period 350 during the first write cycle 320.

During the first write cycle 320, the write sequence 360 may include a current pulse 312 that may be applied on the field line 912 from time $T_B$ to time $T_D$, where time $T_B$ is between time $T_A$ and time $T_C$, and time $T_D$ is after time $T_C$. Alternatively, the current pulse 312 may be applied on the field line 912 from time $T_A$ to time $T_D$. A time duration 300 from time $T_A$ to time $T_B$ may be in the range from about 10 nanoseconds to about 20 nanoseconds, such as about 10 nanoseconds, about 11 nanoseconds, about 12 nanoseconds, about 13 nanoseconds, about 14 nanoseconds, about 15 nanoseconds, about 16 nanoseconds, about 17 nanoseconds, about 18 nanoseconds, about 19 nanoseconds, or about 20 nanoseconds. A time duration 302 from time $T_B$ to time $T_C$ may be in the range from about 4 nanoseconds to about 8 nanoseconds, such as about 4 nanoseconds, about 5 nanoseconds, about 6 nanoseconds, about 7 nanoseconds, or about 8 nanoseconds. A time duration 304 from time $T_C$ to time $T_D$ may be in the range from about 4 nanoseconds to about 8 nanoseconds, such as about 4 nanoseconds, about 5 nanoseconds, about 6 nanoseconds, about 7 nanoseconds, or about 8 nanoseconds.

The time duration of the heating time period 340 during the first write cycle 320 (which may be from time $T_A$ to time $T_C$) may be in the range from about 14 nanoseconds to about 28 nanoseconds, such as about 14 nanoseconds, about 15 nanoseconds, about 20 nanoseconds, about 25 nanoseconds, or about 28 nanoseconds.

The current pulse 312 included in the write sequence 360 may write concurrently to the at least a subset of the magnetic cells 902 corresponding to the first subset of bits in the multi-bit word. The current pulse 312 may write these magnetic cells 902 to the first polarity. For example, the current pulse 312 may write the magnetic cells 902A-902N (corresponding to all bits in the multi-bit word) to the first polarity.

Referring to FIG. 3, in one embodiment the subset of the magnetic cells 902 corresponding to the first subset of bits in the multi-bit word are not heated from time $T_C$ until the end of the first write cycle 320, and are also not heated during the second write cycle 322. The subset of the magnetic cells 902 corresponding to the first subset of bits in the multi-bit word thereby cools below the threshold temperature before a start of the current pulse 314 (time $T_E$), pinning the storage magnetization of these magnetic cells 902 in a direction corresponding to the first polarity. The current pulse 314 (included in the write sequence 360) on the field line 912 therefore does not affect the storage magnetization stored in these magnetic cells 912.

Referring to FIG. 4, in one embodiment the remaining subset of the magnetic cells corresponding to the second subset of bits in the multi-bit word are continuously heated from time $T_A$ at the start of the first write cycle 320 until time $T_F$ during the second write cycle 322. As the remaining subset of the magnetic cells is already above the threshold temperature after an end of the first write cycle 320 (time $T_D$), a time extent of the heating pulse 331 during the second write cycle 322 (time $T_D$ to time $T_F$) can be reduced from a time extent of the heating pulse during the first write cycle 320 (time $T_A$ to time $T_D$). For example, a time duration 306 may be shorter than the time duration 300, while a time duration 308 may be equal to or approximately equal to the time duration 302. A time duration of the second write cycle 322 can therefore be shorter than a time duration of the first write cycle 320, thus increasing a speed of the two-cycle write. After time $T_F$, the remaining subset of the magnetic cells 902 (see FIG. 2) corresponding to the second subset of bits in the multi-bit word cools below the threshold temperature, pinning the storage magnetization of these magnetic cells 902 in a direction corresponding to the second polarity.

Referring to FIGS. 2, 3, and 4, during the second write cycle 322, a current pulse 314 may be applied on the field line 912 from time $T_E$ to time $T_G$, where time $T_E$ is between time $T_D$ and time $T_F$, and time $T_G$ is after time $T_F$. Alternatively, the current pulse 312 may be applied on the field line 912 from time $T_D$ to time $T_G$. The time duration 306 from time $T_D$ to time $T_E$ may be in the range from about 1 nanosecond to about 5 nanoseconds, such as about 1 nanosecond, about 2 nanoseconds, about 3 nanoseconds, about 4 nanoseconds, or about 5 nanoseconds. Alternatively, the time duration 306 may be zero (time $T_D$ equal to time $T_E$) or approximately zero. The time duration 308 from time $T_E$ to time $T_F$ may be in the range from about 4 nanoseconds to about 8 nanoseconds, such as about 4 nanoseconds, about 5 nanoseconds, about 6 nanoseconds, about 7 nanoseconds, or about 8 nanoseconds. The time duration 310 from time $T_F$ to time $T_G$ may be in the range from about 4 nanoseconds to about 8 nanoseconds, such as about 4 nanoseconds, about 5 nanoseconds, about 6 nanoseconds, about 7 nanoseconds, or about 8 nanoseconds.

The time duration of the heating time period 342 during the second write cycle 322 (which may be from time $T_D$ to time $T_F$) may be in the range from about 5 nanoseconds to about 13 nanoseconds, such as about 5 nanoseconds, about 8 nanoseconds, about 10 nanoseconds, and about 13 nanoseconds. Because the remaining subset of the magnetic cells 902 (see FIG. 2) has been pre-heated during the pre-heating time period 350 during the first write cycle 320, the time duration of the heating time period 342 during the second write cycle 322 may be less than the time duration of the heating time period 340 during the first write cycle 320 (for the subset of the magnetic cells 902 that have not been pre-heated). As described previously, for this reason a time duration of the second write cycle 322 can therefore be shorter than a time duration of the first write cycle 320, thus increasing a speed of the two-cycle write.

The current pulse 314 on the field line 912 may write concurrently to the remaining subset of the magnetic cells 902 corresponding to the second subset of bits in the multi-bit word. The current pulse 314 writes these magnetic cells 902 to the second polarity. During the second write cycle 322, the subset of the magnetic cells 902 corresponding to the first subset of bits in the multi-bit word are not heated by the bit lines 916, and are not written to by the field line 912.

Advantageously, the two-cycle write of a multi-bit word to the magnetic cells 902 with a single field line 912 reduces power consumption relative to writing the multi-bit word to the magnetic cells 902 with multiple field lines (such as a separate field line per magnetic cell 902). Also, since the field line 912 may use a bidirectional current pulse with an average current amplitude of zero or approximately zero, the electromagnetic performance of the field 912 can be enhanced.

In addition, the two-cycle write can be suitable for high-speed applications. For example, to accelerate the two-cycle write, the first write cycle 320 can begin before the multi-bit word to be written is known (and/or received by the memory device 200), such as during a turnaround time of a data bus on which the multi-bit word is to be provided. Also, as previously described, the time duration of the second write cycle 322 can be reduced because the magnetic cells 902 may already be heated during the first write cycle 320.

Referring to FIG. 4, in one embodiment, the heating pulse 331 may not extend from time $T_A$ to time $T_F$, but instead may be divided into two current pulses separated by a cooling period. For example, the cooling period may extend from time $T_C$ to time $T_D$, or may extend for a portion of the time between time $T_C$ and time $T_D$. This cooling period may result in an increased time duration of the second write cycle 322 (because the magnetic cells 902 will have at least partially cooled down at the start of the second write cycle 322). At the same time, this cooling period may save power. Power savings can be realized if a time duration of the first write cycle 320 is sufficiently long, such that the increase in the time duration of the second write cycle 322 is less than a duration of the cooling period.

Referring to FIG. 4, in one embodiment, if the multi-bit word is known at the start of the first write cycle 320, the heating pulse 331 may extend from time $T_D$ to time $T_F$, such that the remaining subset of the magnetic cells 902 are not written to the first polarity during the first write cycle 320. Because the remaining subset of the magnetic cells 902 are not heated during the first write cycle 320 in this embodiment, power can be saved. At the same time, because the remaining subset of the magnetic cells 902 have not been heated during the first write cycle 320, the time duration of the second write cycle 322 may increase.

Figure 5:
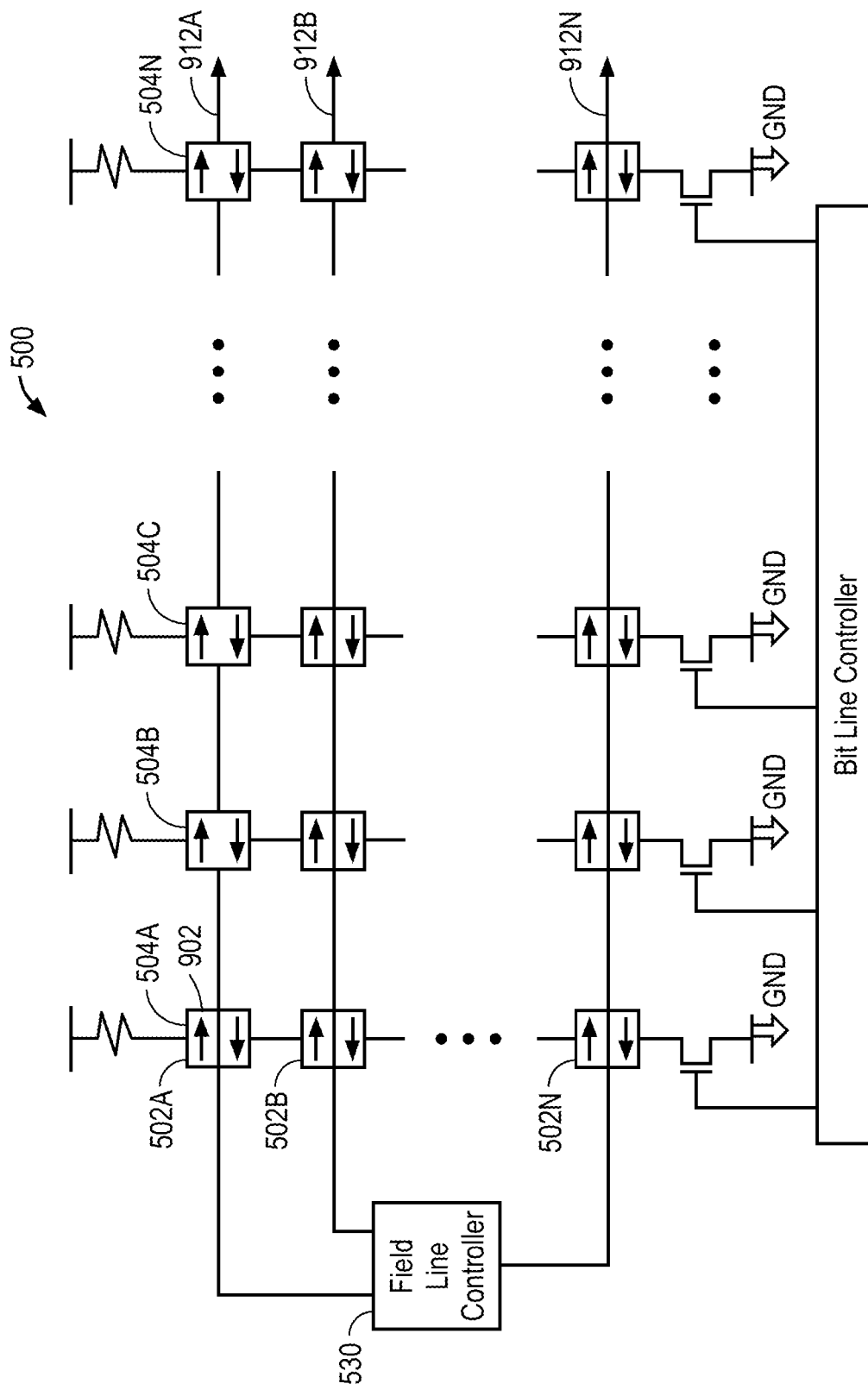
FIG. 5 illustrates a memory device including an array of magnetic cells and a plurality of field lines, according to an embodiment of the invention.

Referring to FIG. 2, in one embodiment, it is contemplated that the memory device 200 may include additional rows of multiple magnetic cells 902, where each of the additional rows is magnetically coupled to a corresponding additional field line 912. Multiple multi-bit words can be concurrently written to multiple rows of the magnetic cells 902 based on a multi-cycle write based on principles of the two-cycle write described with reference to FIGS. 3 and 4. FIG. 5 illustrates an example. In FIG. 5, a memory device 500 including an array of magnetic cells 902 and a plurality of field lines 912 is illustrated, according to an embodiment of the invention. The array of magnetic cells 902 includes a plurality of rows 502 and a plurality of columns 504. A field line controller 530 may be coupled to the plurality of field lines 912, and may generate a write signal that traverses each of the field lines 912. A bit line controller 540 may be coupled to the plurality of bit lines 916, and may generate a heating signal that traverses each of the bit lines 916. Based on principles of the two-cycle write described with reference to FIGS. 3 and 4, the write signals generated by the field line controller 530 and the heating signals generated by the bit line controller 540 may write multiple multi-bit words to the multiple rows 502 of magnetic cells 902.

In one embodiment, the field line controller 530 generates write signals that write N multi-bit words to N corresponding rows of the magnetic cells 902 in $2^N$ write cycles. An illustrative example for N=2 is described. The magnetic cells 902 can be disposed in an array having two rows and M columns (where M is the number of bits in each multi-bit word), with each of two field lines 912 being magnetically coupled to a corresponding row of the magnetic cells 902, and each of M bit lines 916 being electrically connected to a corresponding column of the magnetic cells 902. In one embodiment, in a first write cycle, the magnetic cells 902 are heated by the M bit lines 916, and the two field lines can write the two rows of the magnetic cells 902 to a first combination of values (0, 0), respectively, where 0 refers to the first polarity. In a second write cycle, the magnetic cells 902 are heated, except for any column of the magnetic cells 902 that corresponds to values of (0, 0) in the two multi-bit words, as those columns of the magnetic cells 902 need not be perturbed further. The two field lines can write each of the remaining rows of the magnetic cells 902 to a second combination of values, such as (0, 1), respectively, where 1 refers to the second polarity. In a third write cycle, the magnetic cells 902 are heated, except for any column of the magnetic cells 902 that corresponds to values of (0, 0) or (0, 1) in the two multi-bit words, as those columns of the magnetic cells 902 need not be perturbed further. The two field lines can write each of the remaining rows of the magnetic cells 902 to a third combination of two values, such as (1, 0), respectively. In a fourth write cycle, the magnetic cells 902 are heated, except for any column of the magnetic cells 902 that corresponds to values of (0, 0), (0, 1), or (1, 0) in the two multi-bit words, as those columns of the magnetic cells 902 need not be perturbed further. The two field lines can write each of the remaining rows of the magnetic cells 902 to a fourth combination of two values, such as (1, 1), respectively. Therefore, it can be seen that two field lines 912 can write two multi-bit words to two corresponding rows of the magnetic cells 902 in 4 ($2^2$) write cycles. Similarly, this example can be extended to N field lines 912, where N is greater than 2. As described previously, the N field lines 912 can write N multi-bit words to N corresponding rows of the magnetic cells 902 in $2^N$ write cycles.

In the above example, in an initial write cycle (which could be any of the first, second, or third write cycles described above), each of a plurality of write signals writes concurrently to corresponding ones of the plurality of rows 502 of the magnetic cells 902 such that each of at least a first subset of the plurality of columns 504 of the magnetic cells 902 is configured to a first state. For example, for the first write cycle, the first state is (0, 0), for the second write cycle, the first state is (0, 1), and for the third write cycle, the first state is (1, 0). It is contemplated that the first state may be any combination of N values (one value per row 502). In one embodiment, each of the plurality of columns 504 of the magnetic cells 902 may be configured to the first state. Alternatively, a first subset of the plurality of columns 504 of the magnetic cells 902 may be configured to the first state.

In the above example, in a subsequent write cycle (which, for example, could be any of the second, third, or fourth write cycles described above if the initial write cycle is the first write cycle), each of the plurality of write signals writes concurrently to the each of the plurality of rows 502 of the magnetic cells 902 such that each of a second subset of the plurality of columns 504 of the magnetic cells 902 is configured to an updated state. For example, if the first state is (0, 0), the updated state may be any of (0, 1), (1, 0), or (1, 1). Each of the first subset of the plurality of columns 504 may remain configured to the first state. For example, each of the first subset of the plurality of columns 504 may already store corresponding bit values ((0, 0) in this example) located at a bit position in each of the two multi-bit words that is associated with the first subset of the plurality of columns 504. The first subset of the plurality of columns 504 therefore need not be perturbed further, and can be excluded from the subsequent write cycle. In the subsequent write cycle, the bit line controller 540 may generate a plurality of heating signals that traverse corresponding ones of the second subset of the plurality of bit lines 916 electrically connected to corresponding ones of the second subset of the plurality of columns 504 of the magnetic cells 902.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, or process to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A memory device comprising:
 a plurality of magnetic random access memory (MRAM) cells;
 a field line; and
 a field line controller configured to generate a write sequence that traverses the field line, the write sequence for writing a multi-bit word to the plurality of MRAM cells, the multi-bit word including a first subset of bits having a first polarity and a second subset of bits having a second polarity;
 wherein the write sequence writes concurrently to at least a subset of the plurality of MRAM cells corresponding to the first subset of bits having the first polarity, then subsequently writes concurrently to a remaining subset of the plurality of MRAM cells corresponding to the second subset of bits having the second polarity.

2. The memory device of claim 1, wherein the write sequence orients the subset of the plurality of MRAM cells to the first polarity, and the remaining subset of the plurality of MRAM cells to the second polarity.

3. The memory device of claim 1, wherein:
 the write sequence orients the plurality of MRAM cells to the first polarity during a first write cycle, so that the first write cycle can begin prior to the multi-bit word being received by the memory device; and
 the write sequence orients the remaining subset of the plurality of MRAM cells to the second polarity during a second write cycle.

4. The memory device of claim 1, further comprising a plurality of bit lines, each of the plurality of bit lines being electrically connected to a corresponding one of the plurality of MRAM cells.

5. The memory device of claim 4, further comprising a bit line controller, wherein:
 the bit line controller is configured to generate a first heating signal that traverses each of at least a subset of the plurality of bit lines electrically connected to corresponding ones of the at least a subset of the plurality of MRAM cells;
 the first heating signal heats each of the at least a subset of the plurality of MRAM cells for a heating time period during a first write cycle;
 the write sequence writes concurrently the at least a subset of the plurality of MRAM cells to the first polarity during the first write cycle;
 the bit line controller is configured to generate a second heating signal that traverses each of a remaining subset of the plurality of bit lines electrically connected to corresponding ones of the remaining subset of the plurality of MRAM cells;
 the second heating signal pre-heats each of the remaining subset of the plurality of MRAM cells for a pre-heating time period during the first write cycle, and heats the each of the remaining subset of the plurality of MRAM cells for a heating time period during the second write cycle that is shorter than the heating time period during the first write cycle, so that a duration of the second write cycle is shorter than a duration of the first write cycle; and
 the write sequence writes concurrently the remaining subset of the plurality of MRAM cells to the second polarity during the second write cycle.

6. The memory device of claim 5, wherein the heating time period during the second write cycle overlaps with the pre-heating time period during the first write cycle.

7. The memory device of claim 5, wherein the heating time period during the second write cycle is separated from the pre-heating time period during the first write cycle by a cooling period for the remaining subset of the plurality of MRAM cells.

8. The memory device of claim 5, wherein a duration of the pre-heating time period during the first write cycle is longer than a duration of the heating time period during the first write cycle.

9. The memory device of claim 5, wherein:
the write sequence includes a current pulse that traverses the field line, the current pulse for writing the at least a subset of the plurality of MRAM cells; and
the pre-heating time period during the first write cycle extends from a first time prior to a start time of the current pulse to a second time during the current pulse.

10. A memory device comprising:
an array of magnetic random access memory (MRAM) cells including a plurality of rows and a plurality of columns; and
a plurality of field lines;
a field line controller configured to generate a plurality of write signals, each of the plurality of write signals traversing a corresponding one of the plurality of field lines;
wherein:
in a initial write cycle, each of the plurality of write signals writes concurrently to a corresponding one of the plurality of rows of MRAM cells such that each of at least a first subset of the plurality of columns of MRAM cells is configured to a first state; and
in a subsequent write cycle, each of the plurality of write signals writes concurrently to the corresponding one of the plurality of rows of MRAM cells such that each of a second subset of the plurality of columns of MRAM cells is configured to an updated state, while each of the first subset of the plurality of columns of MRAM cells remains configured to the first state.

11. The memory device of claim 10, wherein in the initial write cycle, each of the plurality of write signals writes concurrently to the corresponding one of the plurality of rows of MRAM cells such that each of the plurality of columns of MRAM cells is configured to the first state.

12. The memory device of claim 10, wherein each of the plurality of write signals writes a corresponding one of a first plurality of multi-bit words to the corresponding one of the plurality of rows of MRAM cells, such that each of the plurality of columns of MRAM cells stores corresponding bit values located at a bit position in each of the first plurality of multi-bit words associated with a corresponding one of the plurality of columns of MRAM cells.

13. The memory device of claim 12, wherein the each of the first subset of the plurality of columns of MRAM cells is excluded from the subsequent write cycle because in the initial write cycle, the each of the first subset of the plurality of columns of MRAM cells was already configured to the corresponding bit values located at the bit position in each of the first plurality of multi-bit words associated with the corresponding one of the first subset of the plurality of columns of MRAM cells.

14. The memory device of claim 10, further comprising:
a plurality of bit lines, each of the plurality of bit lines being electrically connected to a corresponding one of the plurality of MRAM cells; and
a bit line controller, wherein in the subsequent write cycle, the bit line controller is configured to generate a plurality of heating signals that traverse corresponding ones of a subset of the plurality of bit lines electrically connected to corresponding ones of the second subset of the plurality of columns of MRAM cells.

15. A memory device comprising:
a plurality of magnetic random access memory (MRAM) cells;
a field line;
a field line controller configured to generate a write sequence on the field line, wherein the write sequence writes at least a subset of the plurality of MRAM cells to a first value during a first write cycle, and writes a remaining subset of the plurality of MRAM cells to a second value during a second write cycle;
a plurality of bit lines; and
a bit line controller, wherein:
the bit line controller is configured to generate a first heating signal that traverses each of at least a subset of the plurality of bit lines electrically connected to corresponding ones of the at least a subset of the plurality of MRAM cells;
the first heating signal heats each of the at least a subset of the plurality of MRAM cells for a heating time period during a first write cycle;
the bit line controller is configured to generate a second heating signal that traverses each of a remaining subset of the plurality of bit lines electrically connected to corresponding ones of the remaining subset of the plurality of MRAM cells; and
the second heating signal pre-heats each of the remaining subset of the plurality of MRAM cells for a pre-heating time period during the first write cycle, and heats the each of the remaining subset of the plurality of MRAM cells for a heating time period during the second write cycle that is shorter than the heating time period during the first write cycle, so that a duration of the second write cycle is shorter than a duration of the first write cycle.

16. The memory device of claim 15, wherein the write sequence writes concurrently to the at least a subset of the plurality of MRAM cells to the first value during the first write cycle, and writes concurrently the remaining subset of the plurality of MRAM cells to the second value during the second write cycle.

17. The memory device of claim 15, wherein the heating time period during the second write cycle overlaps with the pre-heating time period during the first write cycle.

18. The memory device of claim 15, wherein the heating time period during the second write cycle is separated from the pre-heating time period during the first write cycle by a cooling period for the remaining subset of the plurality of MRAM cells.

19. The memory device of claim 15, wherein a duration of the pre-heating time period during the first write cycle is longer than a duration of the heating time period during the first write cycle.

20. The memory device of claim 15, wherein:
the write sequence includes a current pulse that traverses the field line, the current pulse for writing the at least a subset of the plurality of MRAM cells; and
the pre-heating time period during the first write cycle extends from a first time prior to a start time of the current pulse to a second time during the current pulse.

* * * * *